United States Patent [19]
Philbrick et al.

[11] Patent Number: 5,504,527
[45] Date of Patent: Apr. 2, 1996

[54] IMAGE SENSOR WITH IMPROVED CHARGE TRANSFER INEFFICIENCY CHARACTERISTICS

[75] Inventors: Robert H. Philbrick; Herbert J. Erhardt, both of Rochester, N.Y.

[73] Assignee: Eastman Kodak Company, Rochester, N.Y.

[21] Appl. No.: 268,045

[22] Filed: Jun. 28, 1994

[51] Int. Cl.⁶ .................................................. H04N 5/335
[52] U.S. Cl. ........................................ 348/213; 348/294
[58] Field of Search ................................ 348/207, 294, 348/311, 313, 314, 316, 317, 241, 243, 245; H04N 5/335

[56] References Cited

U.S. PATENT DOCUMENTS

| | | | |
|---|---|---|---|
| 5,038,215 | 8/1991 | Hadfield | 348/313 |
| 5,053,872 | 10/1991 | Matsunaga | 348/313 |
| 5,063,449 | 11/1991 | Shibata et al. | 348/313 |

OTHER PUBLICATIONS

Janesick et al, The Effects of Proton Damage on Charge-Coupled Devices, SPIE/SPSE's Electronic Imaging Science and Technology Conference, Charge-Couplied Devices and Solid State Optical Sensors II, vol. 1147, San Jose Convention Center, Feb. 24, 1991, pp. 1–21.

Hopkinson, Cobalt 60 and Proton Radiation Effects on Large Format, 2-D, CCD Arrays for an Earth Imaging Application, 1992 IEEE NSRE Conference, New Orleans, La., Jul. 13–17, 1992 and submitted to IEEE Transactions on Nuclear Science, NS–38 (6), 1992.

Clark et al, "Radiation Effects on Integrated Circuits", Integrated Circuits for the Space Environment, Space Product News, 6th Edition, Harris Semiconductor Corporation, Sep. 1993.

Brodersen et al, Experimental Characterization of Transfer Efficiency in Charge–Coupled Devices, IEEE Trans. on Electron Devices, vol. ED–22, No. 2, Feb. 1975.

M. G. Collet, The Influence of Bulk Traps on the Charge Transfer Inefficiency of Bulk Charge–Coupled Devices, IEEE Trans. on Electron Devices, vol. ED–23, No. 2, Feb. 1976.

J. D. E. Beynon et al Charge Coupled Devices and Their Applications, McGraw–Hill, New York 1980.

M. J. Howes et al, Charge–Coupled Devices and Systems, John Wiley and Sons, New York 1979.

*Primary Examiner*—Joseph Mancuso
*Assistant Examiner*—Tuan V. Ho
*Attorney, Agent, or Firm*—James D. Leimbach

[57] ABSTRACT

A CCD image sensor having a linear array of individual imaging photodetecting cells aligned along a scanning line for sensing light information and converting the light information to charge carriers. A CCD shift register, adjacent to the linear array of photodetecting cells, is used for receiving and temporarily storing the charge carriers generated by the photodetecting cells of the linear array. The CCD shift register has a plurality of CCD cells, each of the photodetecting cells being associated with at least two CCD cells such that there is an imaging CCD cell for receiving the charge carriers from the associated photodetecting cell, and at least one buffer cell for receiving a pre-loaded signal to reduce charge transfer inefficiency of the charge carriers. A pre-loaded signal is injected into the buffer cells of the CCD shift register and all the cells are clocked out such that the pre-loaded buffer cells are clocked through the image cells to improve charge transfer inefficiency characteristics.

9 Claims, 7 Drawing Sheets

FIG. 6D SG=A(VDC)
(PRIOR ART)

FIG. 6E IG=B(VDC)
(PRIOR ART)

FIG. 7

FIG. 8A  φ1
FIG. 8B  φ2
FIG. 8C  ID
FIG. 8D  SG=A(VDC)
FIG. 8E  IG=B(VDC)

FIG. 9

IMAGE SENSOR WITH IMPROVED CHARGE TRANSFER INEFFICIENCY CHARACTERISTICS

FIELD OF THE INVENTION

The present invention relates to a charge-coupled device (CCD) imager having a reduced charge transfer inefficiency. It also relates to a method for reading out such an image sensor.

BACKGROUND OF THE INVENTION

It is often necessary to operate linear and area array solid state imagers in environments containing high energy radiation, such as gamma and/or proton radiation. Such radiation is known to have degrading effects on semiconductor circuit performance and reliability (See for example, J. Janesick et al, "The Effects of Proton Damage on Charge-Coupled Devices", SPIE/SPSE's Electronic Imaging Science and Technology Conference, "Charge-Coupled Devices and Solid State Optical Sensors II", Vol. 1147, San Jose Convention Center, Feb. 24, 1991 and G. R. Hopkinson, "Cobalt 60 and Proton Radiation Effects on Large Format, 2-D, CCD Arrays for an Earth Imaging Application", 1992 IEEE NSRE Conference, New Orleans, La., Jul. 13–17, 1992 and submitted to IEEE Transactions on Nuclear Science, NS-38 (6), 1992). These radiation effects are of particular concern in environments where no service can be performed to repair the damaged semiconductor components. One such environment is the space occupied by low to medium orbit satellites around the planet Earth.

External shielding aboard satellites is used to decrease the dose of radiation received by the imager. Also, special fabrication processes exist which can minimize the degrading effects of radiation on semiconductor components (See for Example, J. Clark, et al, "Radiation Effects on Integrated Circuits", Integrated Circuits for the Space Environment, Space Products News, 6th Edition, Harris Semiconductor Corporation, September 1993). Application of such processes however, is often prohibited due to the resultant degrading effects on imaging performance parameters like quantum efficiency.

Charge transfer inefficiency (CTI) in CCD imagers and the physical mechanisms causing such inefficiencies have been extensively studied (See for example, R. W. Brodersen, et al, "Experimental Characterization of Transfer Efficiency in Charge-Coupled Devices", IEEE Trans. on Electron Devices, Vol. ED-22, No. 2, February 1975 and M. G. Collet, "The influence of Bulk Traps on the Charge Transfer Inefficiency of Bulk Charge-Coupled Devices", IEEE Trans. on Electron Devices, Vol. ED-23, No. 2, February 1976). These studies have shown that the inefficiency in charge transfer can be proportional to the amount of charge being transferred (i.e. proportional loss), or occurs only at or below certain charge levels (i.e. fixed loss), or both.

SUMMARY OF THE INVENTION

Accordingly, it is an object of the present invention to provide an improved CCD image sensor that overcomes the problems mentioned above.

This object is achieved by providing a CCD image sensor comprising:

a) a linear array of individual imaging photodetecting cells aligned along a scanning line for sensing light information applied thereon and converting the light information to charge carriers;

b) a CCD shift register adjacent to the linear array of photodetecting cells for receiving and temporarily storing the charge carriers generated by the photodetecting cells of the linear array, the CCD shift register having a plurality of CCD cells, each of the photodetecting cells being associated with at least two CCD cells: i) an imaging CCD cell for receiving the charge carriers from the associated photodetecting cell, and ii) at least one buffer cell for receiving a pre-loaded signal to reduce charge transfer inefficiency of the charge carriers;

c) means for injecting the pre-loaded signal into the buffer cells of the CCD shift register; and d) means connected to the CCD cells for clocking out the CCD cells, each of the CCD cells having a first gate electrode and a second gate electrode, all of the first gate electrodes of the CCD shift register being connected to a first clock phase, all of the second gate electrodes of the CCD shift register being connected to a second clock phase.

The object of the present invention is also achieved in a method for, in a CCD image sensor, reading out the charge carriers produced by a linear array of individual imaging photodetecting cells aligned along a scanning line in response to image signals detected by the photodetecting cells, the method comprising the steps of:

a) transferring the charge carriers into a CCD shift register adjacent to the linear array of photodetecting cells, the CCD shift register having a plurality of CCD cells, each of the photodetecting cells being associated with at least two CCD cells: i) an imaging CCD cell for receiving the charge carriers from the associated photodetecting cell, and ii) at least one buffer cell for receiving a pre-loaded signal in order to reduce charge transfer inefficiency of the charge carriers;

b) injecting the pre-loaded signal into the buffer cells of the CCD shift register; and c) clocking out the CCD cells, each of the CCD cells having a first gate electrode and a second gate electrode, all of the first gate electrodes of the CCD shift register being connected to a first clock phase, all of the second gate electrodes of the CCD shift register being connected to a second clock phase.

This invention has applicability in a number of different imaging applications where CTE (charge transfer efficiency) is an important feature.

The following are advantages of the present invention: it reduces the degrading effects of high energy radiation on solid-state image sensors by minimizing the influences of increased CTI on the spatial frequency response of solid state image sensors; it provides a better immunity to charge transfer inefficiency without reducing the dynamic range; the performance and lifetime of CCD imagers operating in environments containing high energy radiation are increased.

These and other objects and advantages of the present invention will become more apparent when taken in conjunction with the following description and drawings wherein like characters indicate like parts and which drawings form a part of the present description.

DETAILED DESCRIPTION OF THE PREFERRED EMBODIMENTS

Figure 1:
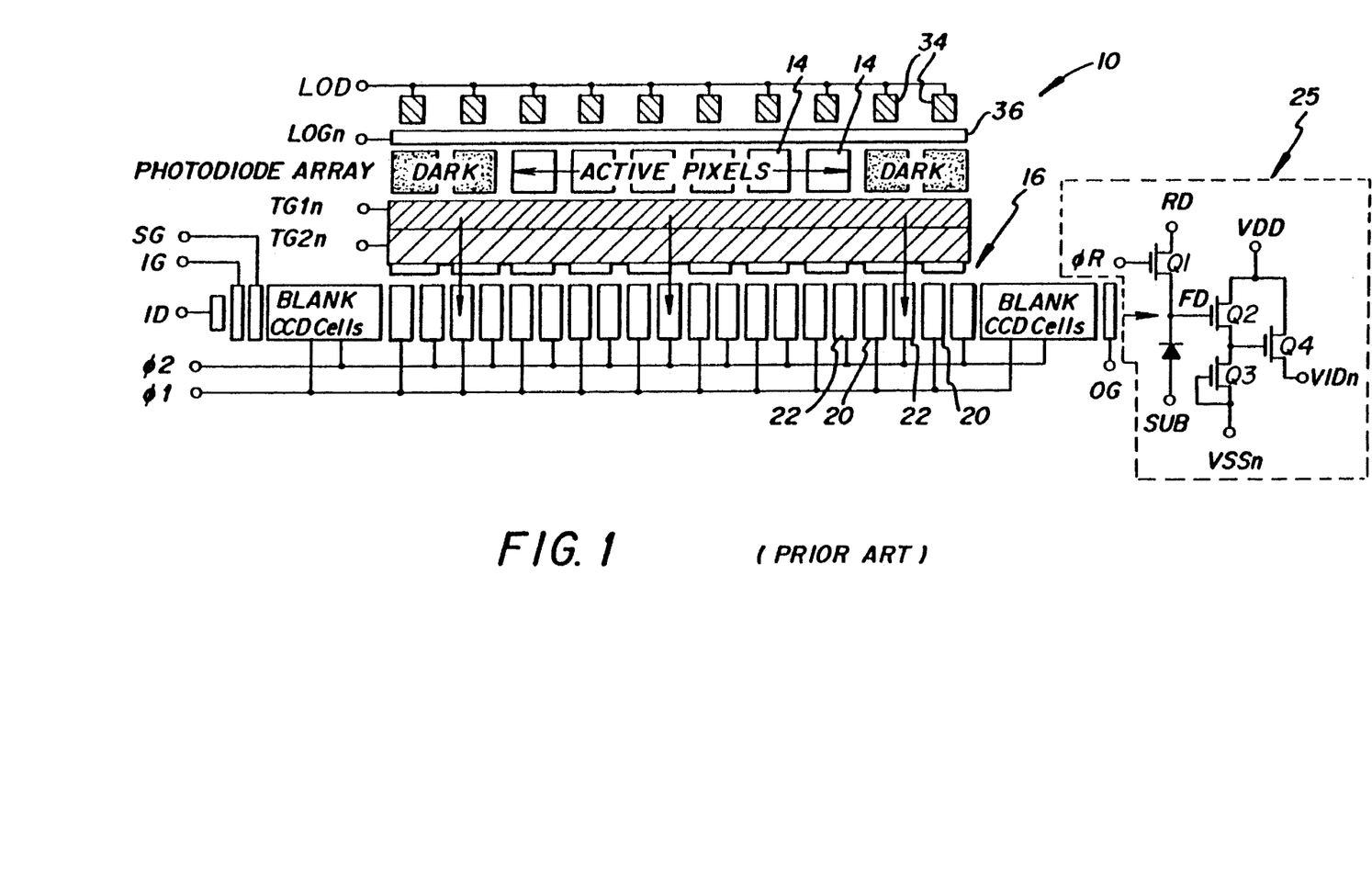
FIG. 1 schematically represents the layout architecture of a conventional linear imager of the prior art.

Referring now to FIG. 1, there is shown a top plane schematic view of a conventional CCD imager. CCD imager 10 comprises a body of a semiconductor material having therein a plurality of imaging photodetectors 14. As shown, the imaging photodetectors 14 are arranged in an array of a line for a linear array. However, the photodetectors 14 can be arranged in an array of rows and columns for an area array. Each of the imaging photodetectors can be of any well known type of photodetectors, such as a photodiode or photocapacitor, which receives photons and converts the photons to charge carriers. Along one side of the line of imaging photodetectors 14 is a CCD shift register 16. CCD shift register 16 comprises a channel region (not shown) extending along and spaced from the line of photodetectors 14. If the channel region is a buried channel, it is a region of a conductivity type opposite that of the body of the CCD imager. A plurality of first gate electrodes 20 are over and insulated from the channel region. The first gate electrodes 20 are spaced along the channel region with each of the first gate electrodes 20 being adjacent a separate imaging photodetector 14. A plurality of second gate electrodes 22 are over and insulated from the channel region. The second gate electrodes 22 are arranged in alternating relation with the first gate electrodes 20 with each of the second gate electrodes 22 being adjacent a separate imaging photodetector 14. Thus there are two gate electrodes, one first gate electrode 20 and one second gate electrode 22 adjacent each imaging photodetector 14 to form a two-phase CCD shift register 16. The gate electrodes 20 and 22 are of a conductive material, such as conductive polycrystalline silicon, and are insulated from the channel region by a layer of an insulating material (not shown), typically silicon dioxide. The first gate electrodes 20 are all connected to a first clock phase $\Phi 1$ and the second gate electrodes are all connected to a second clock phase $\Phi 2$. Each such pair of gate electrode (20, 22) defines a CCD cell.

Transfer gates TG1n and TG2n extend over and are insulated from the body of the imager between the imaging photodetectors 14 and the channel region of the CCD shift register 16. Although two transfer gates are depicted here, it will be appreciated that only one transfer gate is really necessary. At the conclusion of an integration period, the collected photogenerated charges in each pixel are transferred to the adjacent CCD cell by applying the appropriate voltage biases to the TG1n and TG2n pins while the CCD remains in the idle state. At the conclusion of the charge transfer, the transfer gate clocks are returned to the isolation potentials and the CCD clocking resumes. As each charge packet is clocked over the OG potential at the end of the CCD, a corresponding change in output voltage at the VIDn pin of an output circuit 25 is observed. This circuit includes transistors $Q_1$, $Q_2$, $Q_3$ and $Q_4$ and a floating diffusion FD (drawn as a diode). RD represents a DC level and $\Phi R$ is a reset input. ViDn is the circuit output and VSSn is output ground and VDD is a power supply voltage.

A separate exposure drain region 34 (often referred to as a lateral overflow drain) is in the body of the imager, adjacent to, but spaced from the side of each imaging photodetector 14 opposite the CCD shift register 16. An exposure control gate 36 extends over and is insulated from the body of the imager between the imaging photodetectors 14 and the exposure drain regions 34. A light shield (not shown) covers the entire imager except over photodiodes (pixels). A lateral overflow gate ($LOG_n$) is used to collect blooming charge from overflowing photodiodes.

A more detailed description of the operation of CCD based solid state imagers can be found in J. D. E. Beynon et al, "Charge-Coupled Devices And Their Applications", McGraw-Hill, New-York, 1980 and M. J. Howes et al, "Charge-Coupled Devices and Systems" John Wiley and Sons, New-York, 1979.

Figure 2A:
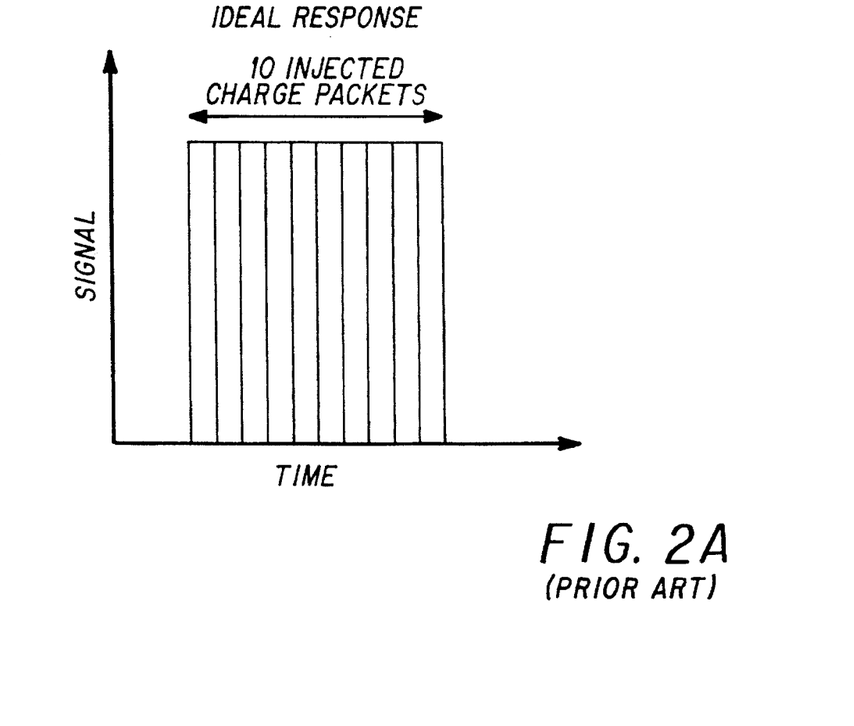
FIGS. 2A–2B show the ideal output response of a CCD imager and the output response of a CCD imager of the prior art suffering from a proportional type CTI loss mechanism.
Figure 2B:
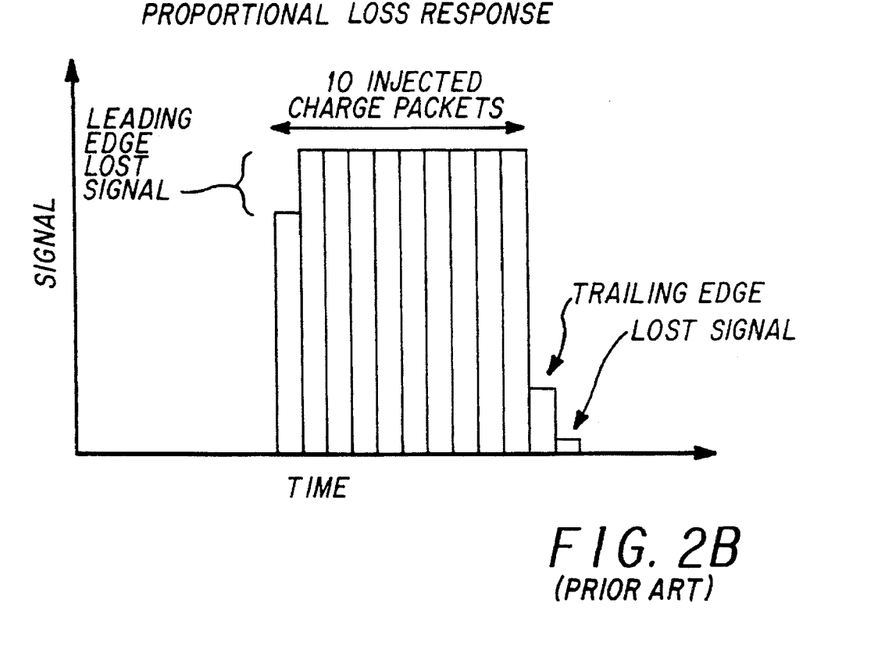

FIGS. 2A–2B illustrate the resultant CCD imager output response to a sequence of electrically injected charge packets for an imager suffering exclusively from a proportional loss mechanism. An imager with exceptional charge transfer efficiency (CTE) would produce a near perfect square wave output (FIG. 2A). In FIG. 2B, note that the amount of charge lost on the rising edge of the charge packet sequence appears mostly in the first few trailing pixels.

Figure 3A:
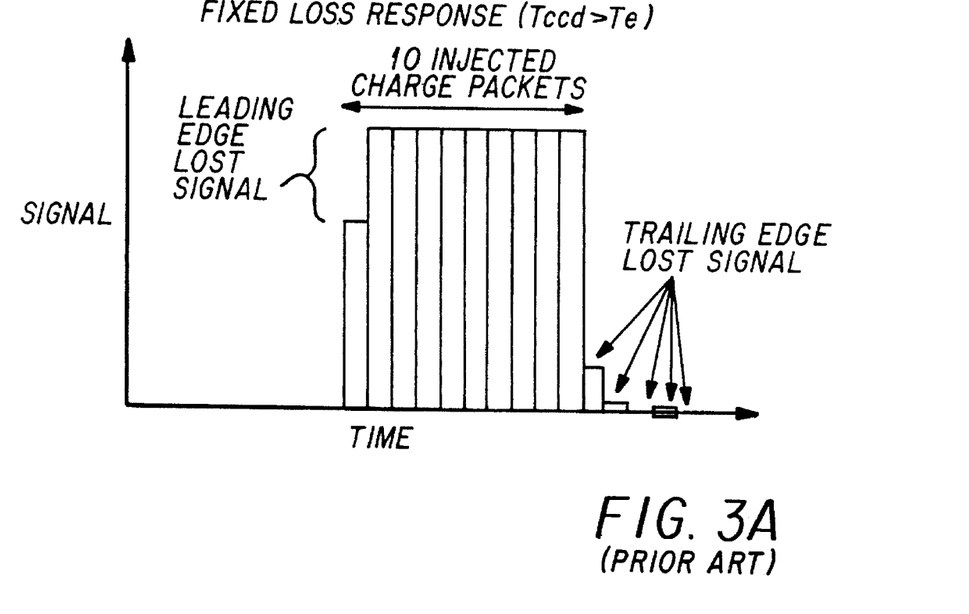
FIGS. 3A–3B show the output response of a CCD imager of the prior art suffering from a fixed type CTI loss mechanism.
Figure 3B:
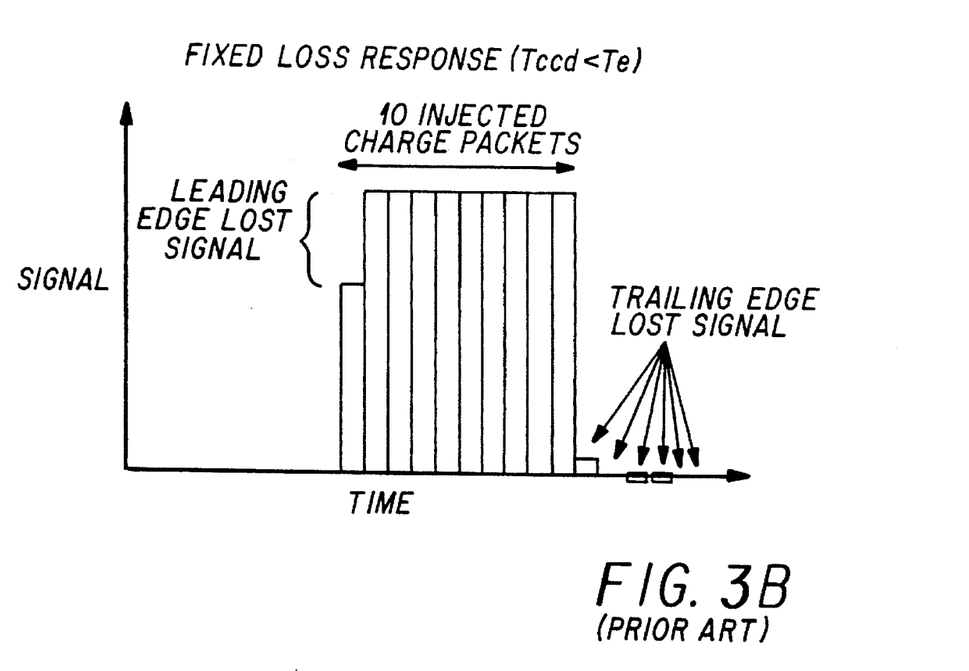

FIGS. 3A–3B illustrate the resultant CCD imager output response to a sequence of electrically injected charge packets for an imager suffering from a fixed loss mechanism. CTI due to a fixed loss mechanism may also result in the lost charge appearing in the first few trailing pixels or it may appear spread over many trailing pixels. The exact distribution of trailing charge is determined by the electron trap emission time (Te) and by the CCD clocking period (Tccd). FIG. 3A illustrates the response when the CCD clocking period is greater than the trap emission time. FIG. 3B illustrates the response when the CCD clocking period is less than the trap emission time.

Figure 4:
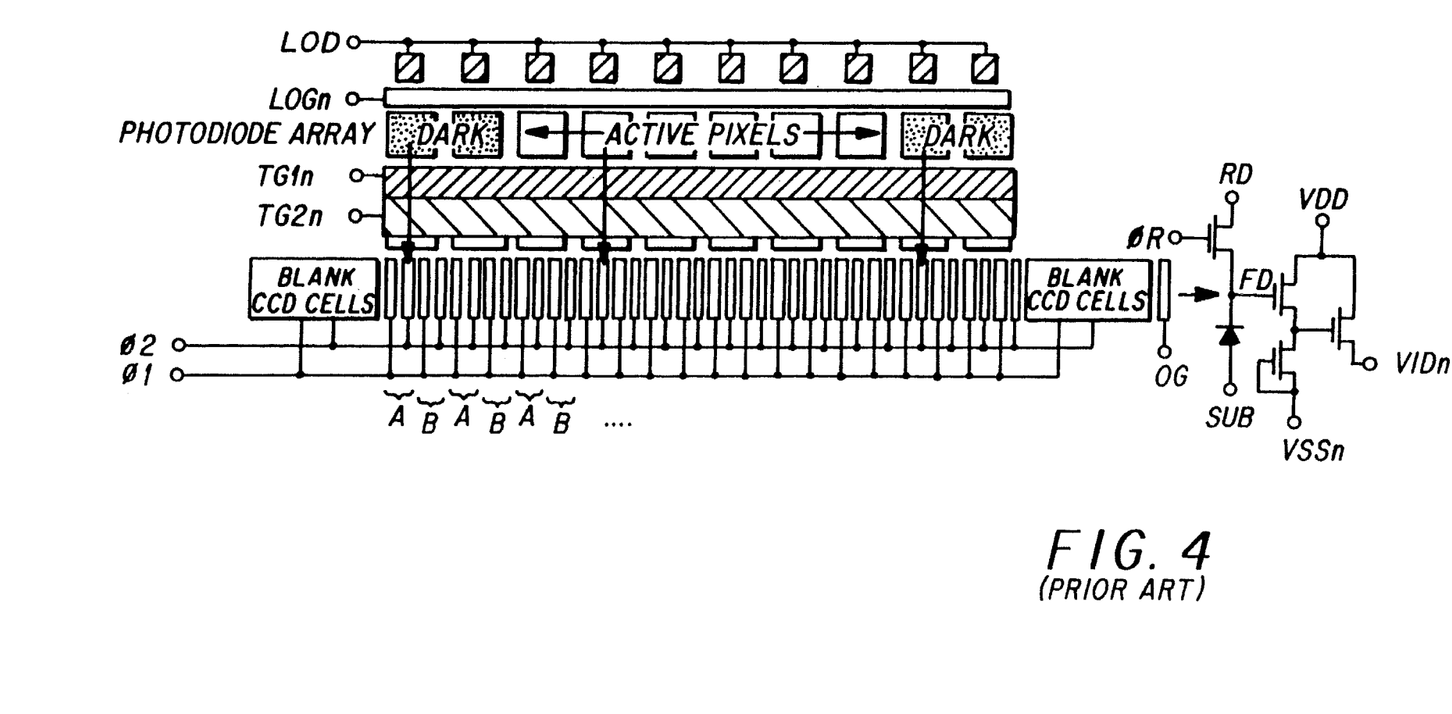
FIG. 4 schematically represents the layout architecture of another linear imager of the prior art.

FIG. 4 represents an imager that differs from the one shown in FIG. 1 in that it contains two CCD cells for each imaging pixel. One cell contains the image signal from the associated photodetecting cell and the other adjacent cell is used to collect charge due to poor CTI. For such imagers, the trailing cell signal can be added back to the original pixel signal, either through the use of an on-chip summing amplifier or through the use of external circuitry. In FIG. 4, captured photogenerated charge is transferred into the phase 2 region of each 'A' CCD cell. Once CCD clocking has begun, the 'B' CCD cell is used to collect any charge left behind during clocking from the leading 'A' cell. At the output, the 'A' CCD signal is transferred onto a small capacitor, generating a corresponding change in output voltage (Vout= Charge/Capacitance). Then, the 'B' CCD signal is added to the capacitor and the final output signal is recorded. Finally, the reset gate signal (PHIR) is applied to clear all charge off of the small capacitor, and the process repeats until all CCD cells have been clocked out. If the distribution of CTI charge is spread over several trailing CCD cells, then the CCD architecture shown in FIG. 4 would yield very little improvement.

Figure 5:
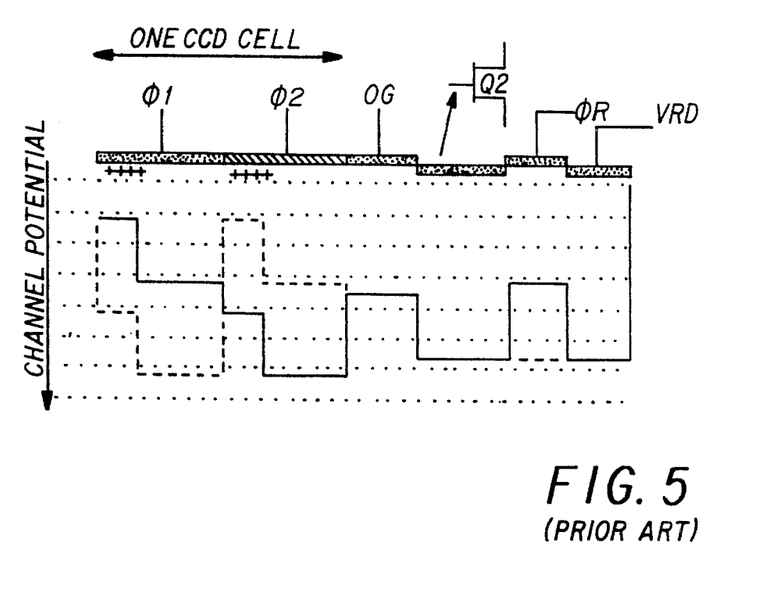
FIG. 5 illustrates the channel potential diagram at the output end of the linear imager of FIG. 1.
Figure 6A:
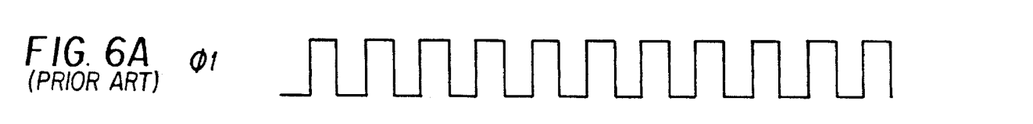
FIG. 6 is an input timing diagram for the electrical injection circuitry of the CCD imager shown in FIG. 1.
Figure 6B:
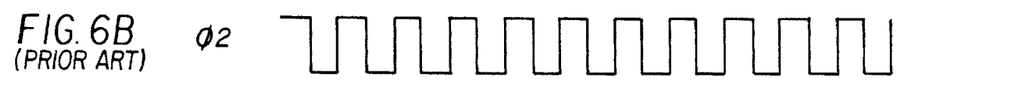
Figure 6C:
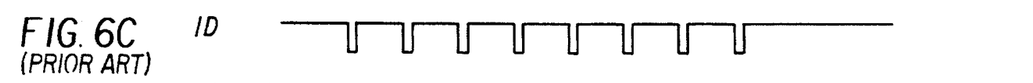
Figure 6D:
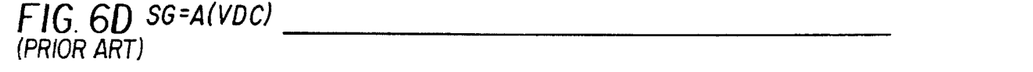
Figure 6E:
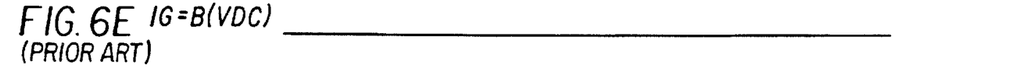

The CCD imager shown in FIG. 1, to which it is made reference again, is equipped with electrical injection circuitry (IG, SG, and ID). This circuitry is used to inject charge packets of known size into each and every CCD cells. Such circuitry is used to measure the transfer efficiency of the CCD, by injecting a short sequence of consecutive charge packets into the CCD and by evaluating the resultant output. FIG. 5 is a channel potential diagram of the imager of FIG. 1. The timing required to perform such an injection sequence is shown in FIG. 6. The timing of FIG. 6 would result in a sequence of eight consecutive charge packets being injected into the CCD. Another use for the electrical injection circuitry is to minimize the effects of CTI in CCDs by injecting a small charge packet into every CCD cell (also called a "fat zero"). The "fat zero" charge will fill and keep filled, many of the traps within the CCD; thus resulting in improved charge transfer efficiency. This technique is limited in its usefulness due to the fact that only a small charge packet can be added to each cell. Traps located at higher potential energies within the CCD will not be filled by these small charge packets. Adding larger charge packets to each CCD cell further reduces the dynamic range of the imager by reducing the maximum signal that can be contained within the CCD. In addition, noise on the ID, SG, and IG signals will result in varying charge packets being injected; thus, increasing the noise of the CCD and reducing the overall dynamic range of the imager.

Figure 7:
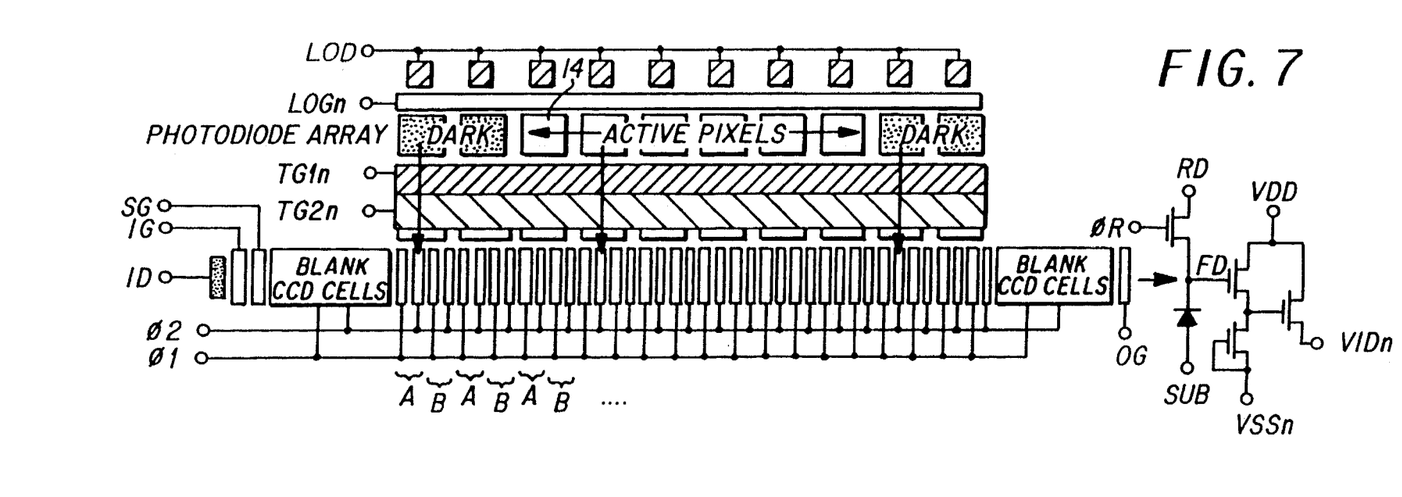
FIG. 7 schematically represents the architecture layout of a preferred embodiment of the CCD imager according to the invention.
Figure 8A:
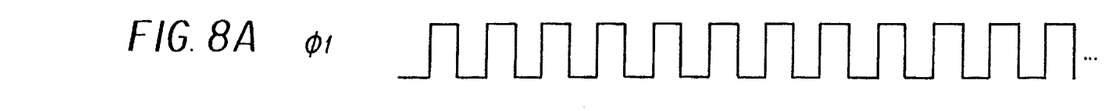
FIG. 8 is an input diagram for the electrical injection circuitry of the CCD imager of FIG. 7.
Figure 8B:
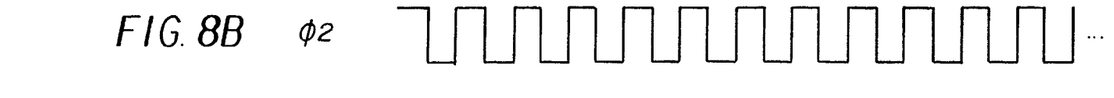
Figure 8C:
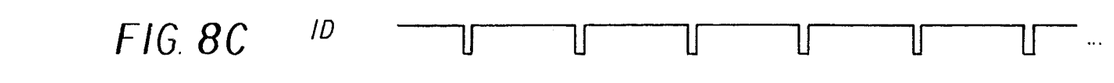
Figure 8D:
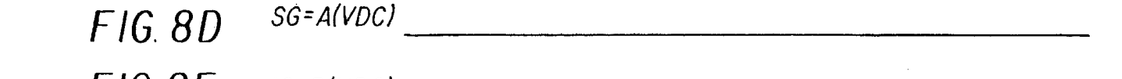
Figure 8E:
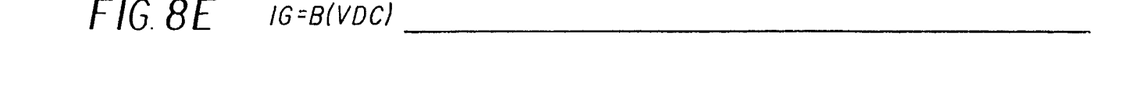

FIG. 7, schematically illustrates the architecture layout of a preferred embodiment of the CCD image sensor according to the invention. Where parts correspond to those discussed above, the same numerals will be used. Each photodetecting cell 14 is associated with a pair of CCD cells (A, B): an imaging CCD cell A for receiving the charge carriers from the associated photodetecting cell 14, and a buffer cell B for receiving a pre-loaded signal to reduce charge transfer inefficiency of the charge carriers, as discussed in the above discussion within CCD register 56. Each cell (A,B) contains two electrodes for the case of a two-phase CCD as shown. The presence of the inter-spaced buffer CCD cells will reduce the charge transfer inefficiency of the image signal due to the fact that the buffer CCD cell signal will keep the electron traps filled with the non imaging signal; thus allowing the imaging signal to be transferred out of the CCD with little, if any, charge loss.

In fact, each photodetecting cell may be associated with more than two CCD cells. Electrical injection circuitry SG, IG, and ID is provided at the input end of the CCD imager and clocked such that a near maximum level charge signal is injected into each extra CCD cell only, i.e. each buffer cell B (See FIG. 8 for the clocking signal ID of every other CCD cell). As shown in FIGS. 1 and 7, there are several inputs SG (signal gate), IG (injection gate) and ID (injection diode). These items are well known in the art. SG and IG in combination set a potential difference between IG and SG to adjust the amount of charge which can be injected by ID. Once the injection is completed, the integrated photodiode charge is then transferred into the adjacent CCD cells and normal CCD clocking is begun. The extra CCD buffer cells will produce a near maximum output voltage at the imager output pin which can be ignored. According to the above discussed preferred embodiment, the pre-loaded signal injected into the inter-spaced buffer cells is such that it substantially fills the buffer cells. The reason for such a choice is that traps can be located at different potential energies within the CCD. By substantially filling the buffer cells, most of the traps are filled with charges. However, it will be appreciated that a substantial improvement, even if not optimum, can be obtained by injecting a signal of a level less than the near maximum level.

In the preferred embodiment shown in FIG. 7, the buffer cells are loaded serially, for example, during the readout of the previous imaging line. Alternatively, an electrical injection circuit (not shown) could be added in parallel with the CCD to inject a near maximum signal into the extra CCD buffer cells only. By substantially completely filling the extra CCD buffer cells (i.e. the CCD cells spaced between the CCD cells which are to contain the actual imaging data), the overall CTI of the CCD can be significantly reduced without reducing the dynamic range of the CCD.

Figure 9:
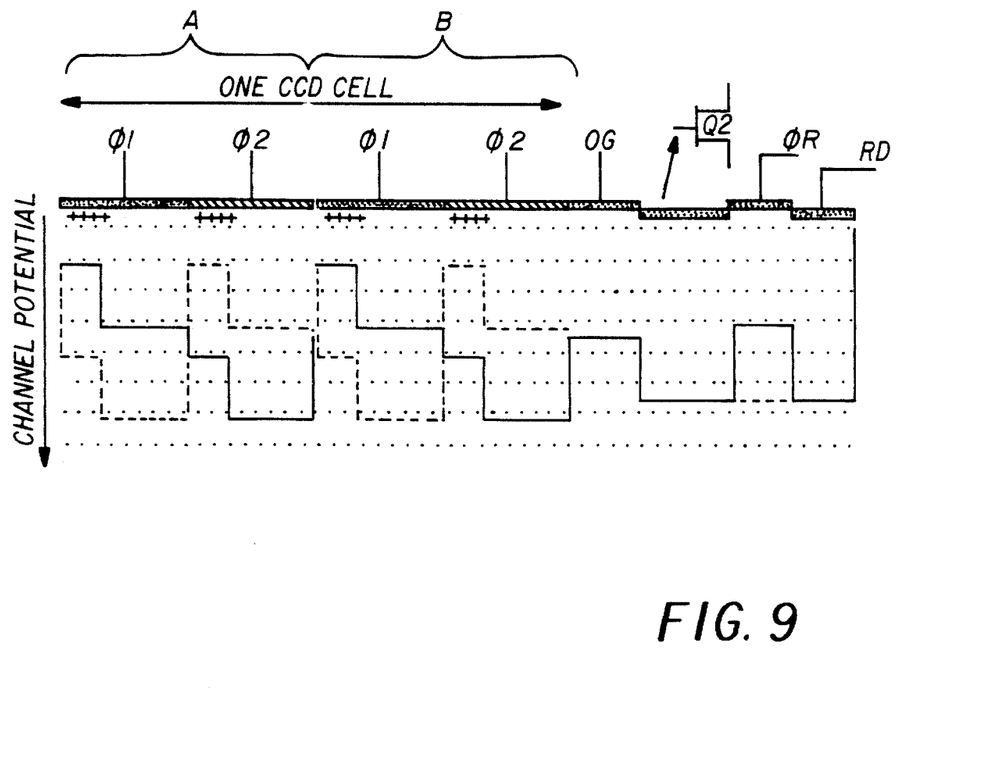
FIG. 9 illustrates the channel potential diagram at the output end of the CCD shown in FIG. 7.

FIG. 9 shows the channel potential diagram at the output end of the CCD imager according to the invention. More particularly, this view shows in more detail a portion of FIG. 7 along with a channel potential diagram.

The invention has been described in detail with particular reference to certain preferred embodiments thereof, but it will be understood that variations and modifications can be effected within the spirit and scope of the invention.

PARTS LIST

10 CCD imager
14 photodetecting cells
16 CCD shift register
20 first gate electrodes
22 second gate electrodes
25 output circuit
34 exposure drain region
36 exposure control gate

What is claimed is:

1. A CCD image sensor comprising:

a) a linear array of individual imaging photodetecting cells for sensing light information applied thereon and converting such light information to charge carriers;

b) a CCD shift register disposed adjacent to said linear array of photodetecting cells for receiving and temporarily storing the charge carriers generated by the photodetecting cells of said linear array, said CCD shift register having a plurality of CCD cells, each of said photodetecting cells being associated with at least two CCD cells: i) an imaging CCD cell for receiving the charge carriers from the associated photodetecting cell, and ii) at least one buffer cell for receiving a preloaded signal to reduce charge transfer inefficiency of said charge carriers;

c) means for injecting said pre-loaded signal into the buffer cells of said CCD shift register;

d) means connected to said CCD cells for clocking out said CCD cells, each of said CCD cells having a first gate electrode and a second gate electrode, all of said first gate electrodes of said CCD shift register being connected to a first clock phase, all of said second gate electrodes of said CCD shift register being connected to a second clock phase; and output means for receiving the CCD cells clocked out by the clocking means and using only the imaging CCD cells while ignoring the buffer cells in the final output signal.

2. A CCD image sensor according to claim 1 wherein said pre-loaded signal is such that it substantially fills said buffer cells.

3. A CCD image sensor according to claim 1 wherein said means for injecting said pre-loaded signal into said buffer cells comprises an electrical injection circuit connected to one end of said CCD shift register for serially injecting said pre-loaded signal into said buffer cells.

4. A CCD image sensor according to claim 1 wherein said means for injecting said pre-loaded signal into said buffer cells comprises electrical injection circuits adjacent to each of said buffer cells for injecting in parallel said pre-loaded signals into said buffer cells.

5. A method for, in a CCD image sensor, reading out the charge carriers produced by a linear array of individual imaging photodetecting cells in response to image signals detected by said photodetecting cells, said method comprising the steps of:

a) transferring said charge carriers into a CCD shift register disposed adjacent to said linear array of photodetecting cells, said CCD shift register having a plurality of CCD cells, each of said photodetecting cells being associated with at least two CCD cells: i) an imaging CCD cell for receiving the charge carriers from the associated photodetecting cell, and ii) at least one buffer cell for receiving a pre-loaded signal in order to reduce charge transfer inefficiency of said charge carriers;

b) injecting said pre-loaded signal into the buffer cells of said CCD shift register;

c) clocking out said CCD cells, each of said CCD cells having a first gate electrode and a second gate electrode, all of said first gate electrodes of said CCD shift register being connected to a first clock phase, all of said second gate electrodes of said CCD shift register being connected to a second clock phase;

outputting the CCD cells clocked out and using only the imaging CCD cells while ignoring the buffer cells in the final output signal.

6. A method according to claim 5 wherein said pre-loaded signal is such that it substantially fills said buffer cells.

7. A method according to claim 5 wherein said pre-loaded signal is injected into said buffer CCD cells during the readout of the previous line.

8. A method according to claim 5 wherein said pre-loaded signal is serially injected into said buffer cells.

9. A method according to claim 5 wherein said pre-loaded signal is injected in parallel into said buffer cells.

* * * * *